United States Patent [19]

Ishiyama

[11] 4,047,129

[45] Sept. 6, 1977

[54] ELASTIC SURFACE WAVE FILTER

[75] Inventor: Hideki Ishiyama, Nagaokakyo, Japan

[73] Assignee: Murata Manufacturing Co., Ltd., Nagaokakyo, Japan

[21] Appl. No.: 666,270

[22] Filed: Mar. 12, 1976

[30] Foreign Application Priority Data

Mar. 13, 1975 Japan .............................. 50-34316[U]
Mar. 13, 1975 Japan .............................. 50-34317[U]
Mar. 13, 1975 Japan .............................. 50-34318[U]

[51] Int. Cl.² ..................... H03H 9/04; H03H 9/10; H03H 9/26; H01L 41/04
[52] U.S. Cl. ..................................... 333/72; 310/313; 310/345; 333/30 R
[58] Field of Search .................. 333/72, 30 R; 317/101 R, 101 B, 101 CC; 310/8, 8.1, 8.2, 9.1, 9.4, 9.8; 174/52 R, 52 S, 50.54, 50.62; 29/594, 595, 25, 35

[56] References Cited

U.S. PATENT DOCUMENTS

| 3,512,254 | 5/1970 | Jenkins et al. | 29/620 |
| 3,689,784 | 9/1972 | De Klerk | 310/9.8 |
| 3,694,674 | 9/1972 | Inoue | 310/8.2 |
| 3,872,331 | 3/1975 | Falco | 310/9.4 |
| 3,885,173 | 5/1975 | Lee | 310/9.4 |

FOREIGN PATENT DOCUMENTS 1,389,610 4/1975 United Kingdom .............. 333/30 R Primary Examiner—Alfred E. Smith
Assistant Examiner—Marvin Nussbaum
Attorney, Agent, or Firm— Birch, Stewart, Kolasch & Birch

[57] ABSTRACT

An elastic surface wave filter having a substrate of ceramic material and input and output transducer electrodes of interleaved-comb-type rigidly mounted on one surface of the substrate. A top covering is mounted on the electrode-mounted surface of the substrate. This substrate concurrently serves as a medium through which, when the filter is energized, an elastic surface wave is propagated from the input transducer electrode towards the output transducer electrode and also as a closure for closing the opening of the top covering.

11 Claims, 13 Drawing Figures

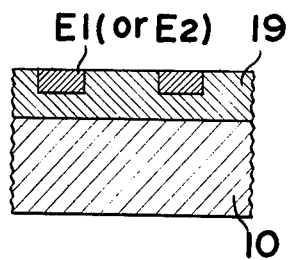
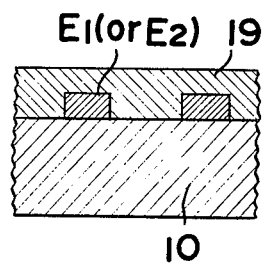
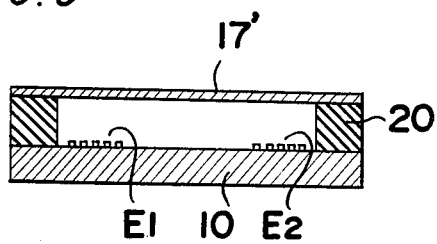
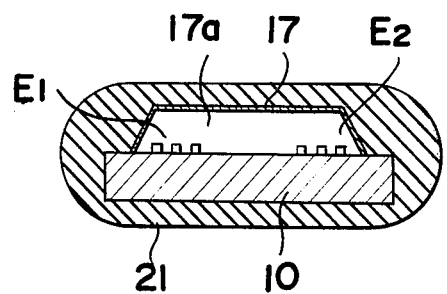
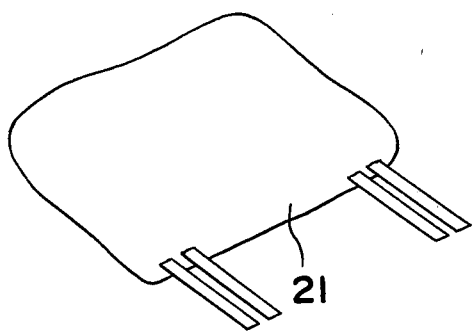
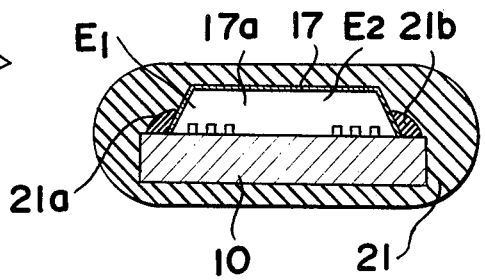
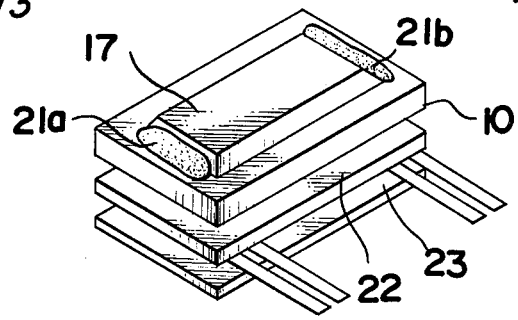

ELASTIC SURFACE WAVE FILTER

The present invention relates to an elastic surface wave filter and, more particularly, to an elastic surface wave filter of a type comprising a substrate of piezoelectric material and a pair of interleaved-comb-type transducing systems.

The elastic surface wave filter of the type referred to above is known. Functionally, when an electric signal from a suitable signal source is applied to one of the transducing systems, a periodic electric field is produced and the input signal is converted into an acoustic surface wave propagating elastically through the piezoelectric substrate by the effect of piezoelectric coupling, which acoustic surface wave is sensed and again converted by the other of the transducing system into an electric output signal to be applied to an external load circuit.

According to the prior art, the piezoelectric substrate with the transducing systems thereon is enclosed in a casing in readiness for actual use in an electric and/or electronic circuitry which requires such elastic surface wave filter. More specifically, the casing comprises an open-ended container or covering and a support base secured by the use of an adhesive sealant to the covering so as to close the opening at one end of said covering. The piezoelectric substrate is housed within the casing in such a manner that one of the opposed surfaces of said substrate remote from the input and output transducing systems is rigidly held in contact with the interior surface of the support base while the other of the opposed surfaces of the same substrate is exposed to an interior chamber defined by the covering mounted on the support base. In other words, the piezoelectric substrate is quite independent and separate of the casing, merely being housed therein.

On the other hand, since the transducing systems are constituted by interleaved-comb-type electrodes each having a pair of comb-type electrode arrays, conductive elements of one comb-type electrode array being interleaved with the condictive elements of the other comb-type electrode array, four terminal pins for external electric connection are employed wherein two of them are coupled to the respective comb-type electrode arrays of the input electrode while the other two are coupled to the respective comb-type electrode arrays of the output electrode. Each of these terminal pins, according to the prior art, extends through the support base, constituting a component of the casing as hereinbefore described, clear of the piezoelectric substrate and is in turn coupled to the adjacent comb-type electrode array by means of a lead wire.

The conventional elastic surface wave filter of the construction described above requires complicated manufacturing procedures with consequently increased manufacturing cost. For example, in view of the fact that the lead wires are employed to connect the comb-type electrode arrays to the associated terminal pins, a relatively great number of soldering connections are required. Moreover, the conventional elastic surface wave filter is so bulky in size that a relatively large space for installation is required, which more or less adversely affects the size of an electric and/or electronic device utilizing such elastic surface wave filter.

Accordingly, the present invention has for its essential object to provide an improved elastic surface wave filter which can readily be manufactured, without incurring substantially increased manufacturing cost, in a substantially compact size, thereby substantially eliminating the disadvantages and inconveniences inherent in the conventional elastic surface wave filter.

According to the present invention, the above described object can readily be accomplished by utilizing the piezoelectric substrate as a component of the casing. More specifically, the elastic surface wave filter herein disclosed substantially comprises a substrate of piezoelectric material having input and output transducer electrodes, formed on one surface thereof, two pairs of terminal pin members coupled to the input and output transducer electrodes with no lead wire employed, and a top covering rigidly mounted on the piezoelectric substrate which piezoelectric substrate serves as the bottom which, together with the top covering, constitutes a casing for the elastic surface wave filter.

These and other objects and features of the present invention will readily become apparent from the following description taken in conjunction with preferred embodiments thereof with reference to the accompanying drawings, in which:

FIGS. 7 and 8 are sectional views of a portion of the substrate showing different methods of formation of the transducer electrodes on the substrate;

FIG. 9 is a sectional view of an elastic surface wave filter according to a still further embodiment of the present invention;

FIG. 10 is a sectional view of an elastic surface wave filter according to a still further embodiment of the present invention;

FIG. 11 is a perspective view of the elastic surface wave filter of FIG. 10 enveloped by a synthetic resinous protective covering;

FIG. 12 is a view similar to FIG. 10, showing a modification of the filter of FIG. 10; and FIG. 13 is a substantial exploded view of an elastic surface wave filter according to a still further preferred embodiment of the present invention.

Before the description of the present invention proceeds, it is to be noted that like parts are designated by like reference numerals throughout the several views of the accompanying drawings.

Figure 1:
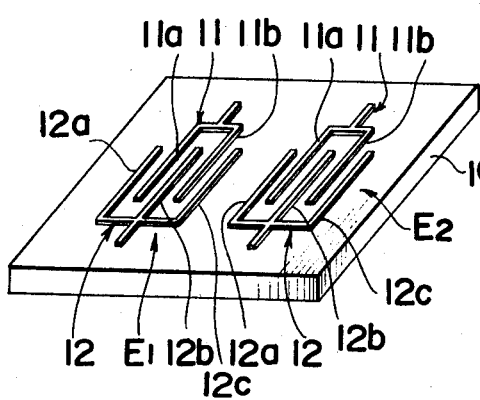
FIG. 1 is a perspective view of a piezoelectric substrate having input and output transducer electrodes formed on one surface thereof.

Referring to FIG. 1, there is shown a piezoelectric substrate 10 made of one of ceramic materials, containing barium titanate, and other ceramic materials, such as PZT or glass or ceramic. This piezoelectric substrate 10 is of substantially rectangular plate-like configuration and has one surface formed with input and output transducer electrodes E1 and E2, what is so called interdigital electrodes, by any known method, for example, by means of photo-etching technique, spattering technique, vacuum evaporation coating technique, electro-plating technique or diffusion technique.

So far illustrated, each of the input and output transducer electrodes E1 and E2 is constituted by a pair of comb-type electrode arrays 11 and 12. One of the comb-type electrode arrays 11 has two conductive elements 11a and 11b which are interleaved with three conductive elements 12a, 12b and 12c of the other of the electrode arrays 12.

Figure 2:
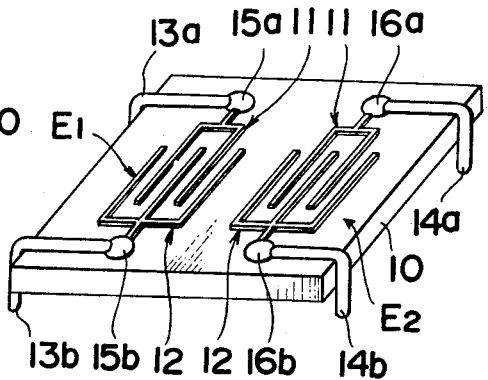
FIG. 2 is a view similar to FIG. 1, showing two pairs of terminal pin members connected to the input and output transducer electrodes according to one preferred embodiment of the present invention.

As best shown in FIG. 2, the electrode arrays in one pair of the input transducer electrode E1 are adapted to be coupled to a source of electrical input signal (not shown) while the electrode arrays in one pair of the output transducer electrode E2 are adapted to be coupled to an external electrical load circuitry (not shown). For this purpose, two pairs of terminal pin members 13a, 13b and 14a, 14b, one pair for each transducer electrode, are respectively coupled to the electrode arrays 11, 12 of the input transducer electrode E1 and the electrode arrays 11, 12 of the output transducer electrode E2. More particularly, in the embodiment shown in FIGS. 2 and 3, each of the terminal pin members 13a, 13b, 14a and 14b has one end soldered at 15a, 15b, 16a or 16b to the corresponding comb-type electrode array of the transducer electrode and the other end adapted to be coupled to an external circuit wiring, a portion adjacent said one end of said terminal pin member laying on and extending outwardly along the electrode-mounted surface of the substrate 10 from the corresponding electrode array. These terminal pin members 13a, 13b, 14a and 14b may be in the form of a lead wire.

Figure 3:
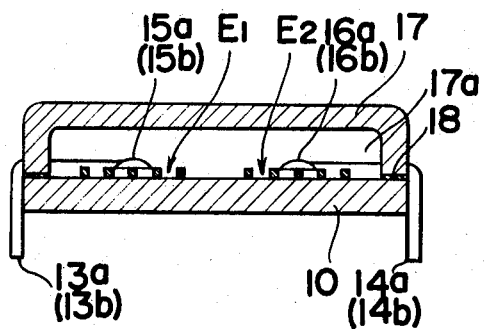
FIG. 3 is a cross sectional view of an elastic surface wave filter employing the piezoelectric substrate shown in FIG. 2.

As best shown in FIG. 3, a top covering 17 is mounted on the substrate 10 with a peripheral face thereof rigidly secured at 18 to a peripheral portion of the electrode-mounted surface of said substrate 10 by means of an adhesive sealant. It is to be noted that the top covering 17 in the instance as shown has a recess 17a defined therein, which recess 17a, when the top covering 17 is mounted on the substrate 10 in the manner as herein-before described, forms an interior chamber substantially above the input and output transducer electrodes E1 and E2. In practice, the recess or interior chamber 17a is preferably filled with an inert gas such as nitrogen.

From the foregoing, it is clear that the substrate 10 serves not only as a support for the input and output transducer electrodes, but also as a closure for closing the opening of the top covering 17 leading into the interior chamber 17a.

Figure 4:
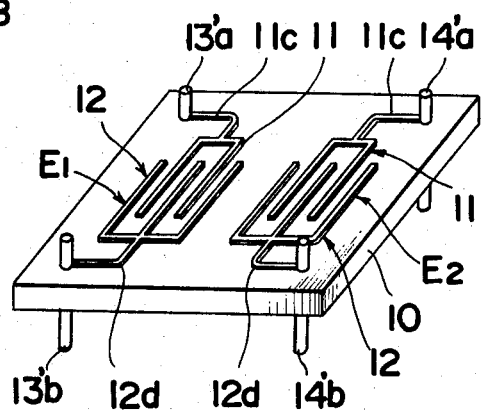
FIG. 4 is a view similar to FIG. 2, showing two pairs of terminal pin members connected to the input and output transducer electrodes in a manner different from that in FIG. 2.
Figure 5:
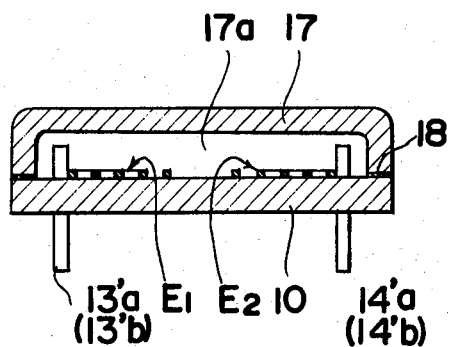
FIG. 5 is a view similar to FIG. 3, showing the elastic surface wave filter employing the piezoelectric substrate shown in FIG. 4.

In the embodiment shown in FIGS. 4 and 5, the elastic surface wave filter differs from the construction of FIGS. 2 and 3 in that the terminal pin members 13'a, 13'b, 14'a and 14'b extend axially non-movably through the substrate 10 and are in turn coupled to the associated electrode arrays 11 and 12 of the input and output transducer electrodes E1 and E2 by way of common conductive extensions 11c and 12d integral with the electrode arrays 11 and 12 of the input and output transducer electrodes E1 and E2, respectively.

In the embodiment shown in FIG. 6, the input and output transducer electrodes E1 and E2 are mounted on the piezoelectric substrate 10 through a thin piezoelectric layer 19 made of piezoelectric material such as ZnO or CdS. more specifically, the thin layer 19 is deposited on one surface of the substrate 10 by means of the known spattering technique, the transducer electrodes E1 and E2 being subsequently formed on an outer surface of the thin layer 19 by any known method.

Figure 6:
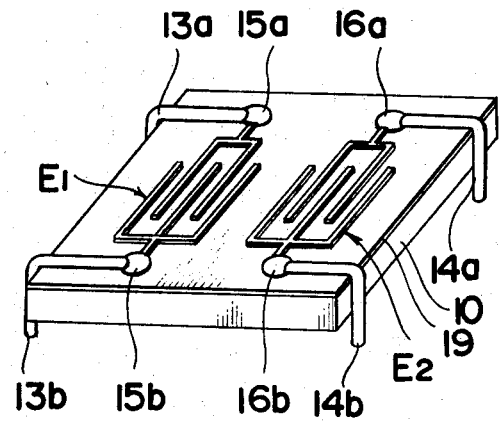
FIG. 6 is a view similar to FIG. 2, showing a further embodiment of the present invention.

The embodiment of FIG. 6 is shown as applied to the assembly shown in FIG. 2. However, it is to be noted that it can equally be applicable to the assembly shown in FIG. 4. it is further to be noted that, where the thin layer 19 of piezoelectric material such as ZnO or CdS is interposed between the substrate 10 and the input and output transducer electrodes E1 and E2, glass is preferred as material for the substrate 10.

As shown in FIG. 7, the transducer electrodes E1 and E2 may be partially embedded in the thin layer 19 with the conductive elements thereof partially bared to the interior chamber 17a. Embedding the transducer electrodes E1 and E2 in the manner shown in FIG. 7 can readily be achieved by the known diffusion transfer method. Alternatively, as shown in FIG. 8, the transducer electrodes E1 and E2 may be interposed between the substrate 10 and the thin layer 19 of piezoelectric material.

In the foregoing embodiments, the top covering 17 has been described as having the recess 17a defined therein. However, the top covering may, as shown by 17' in FIG. 9, be in the form of a flat plate, in which case the top covering 17' is mounted on the substrate 10 through a perforated spacer 20 similar in shape to any of the top covering 17' and substrate 10. The spacer 20 is preferably made of synthetic or natural rubber material so that it provides a substantially damping effect to the elastic surface wave propagating through the substrate 10.

The elastic surface wave filter according to any of the foregoing embodiments may be enveloped by a protective covering of synthetic resin or glass material such as shown in FIGS. 10 and 11 and FIG. 12. The protective covering 21 can readily be formed merely by dipping the surface wave filter into a molten synthetic resin or glass material and then allowing the coated synthetic resin or glass to solidify. Care must be taken during the dipping process that outer portions of the terminal pin members should not be coated with the synthetic resin or glass material which ultimately forms the protective covering 21.

It is to be noted that, in the embodiment shown in FIG. 12, elastic damper material, preferably made of silicone rubber, is applied as at 21a and 21b on both sides of and externally of the top covering 17 and adjacent the outer periphery of said top covering 17. Alternatively, although not shown, these elastic damper materials 21a and 21b may be applied inside the top covering and adjacent the outer periphery of the top covering 17.

Furthermore, depending upon the design of the complete elastic surface wave filter, an elastic damper material may be applied over the entire outer periphery of the top covering 17, instead of the employment of the separate elastic damper materials 21a and 21b.

In the embodiment shown in FIG. 13, the elastic surface wave filter of any of the foregoing constructions may include one or both of a damper plate 22, made of silicone rubber, and a base plate 23. So far illustrated in FIG. 13, the damper plate 22 is bonded to the other of the opposed surfaces of the substrate 10 remote from the transducer electrodes E1 and E2 while the base plate 23 is bonded to the damper plate 22 with the latter situated between said substrate 10 and said base plate 23.

The base plate 23 is provided for the purpose of imparting an additional physical strength of the elastic surface wave filter and, particularly, the substrate 10. Where the substrate 10 has a sufficient physical strength, this base plate 23 may be omitted.

The assembly shown in FIG. 13 is preferably enveloped by the protective covering 20 shown in FIGS. 10 and 12.

Preferably, where the elastic surface wave filter is not provided with such damper elements as designated by 21a and 21b and 22, the protective covering 20 is prepared from a synthetic resinous material having a relatively high elasticity.

The employment of the protective covering 17 provides such additional advantages that oxidation of the input and output transducer electrodes E1 and E2 can substantially be avoided, that the resistance of the surface wave filter to an external impact or vibrations can substantially be improved, and that interference between the surface wave propagating through the substrate and an external noise can substantially be eliminated.

Although the present invention has fully been described by way of the perferred embodiments thereof with reference to the accompanying drawings, it is to be noted that various changes and modifications are apparent to those skilled in the art. Such changes and modifications are to be included within the true scope of the present invention unless they depart therefrom.

What is claimed is:

1. An elastic surface wave filter which comprises:
    a substrate of peizoelectric property having opposed surfaces and interleaved-comb-type transducer electrodes formed on one of said opposed surfaces, one of said transducer electrodes being adapted to be coupled to a source of electric input signal and the other said transducer electrodes being adapted to be coupled to an external load circuitry, said transducer electrodes being formed on said one of said opposed surfaces of said piezoelectric substrate in spaced, but piezoelectrically coupled, relation to each other;
    a top covering rigidly mounted on said one of said opposed surfaces of said piezoelectric substrate and defining an interior chamber between said top covering and said substrate;
    each of said transducer electrodes including a pair of comb-type electrode arrays interleaved with each other; and
    elongated terminal members one for each comb-type electrode array, each of said elongated terminal members having one end coupled to the associated comb-type electrode array and the other end extending outwardly from said substrate for external electrical connection.

2. A filter as claimed in claim 1, further comprising a thin layer of peizoelectric material on said one of said opposed surfaces and said transducer electrodes being mounted on said one of said opposed surfaces of said substrate through said thin layer.

3. A filter as claimed in claim 1, further comprising a thin layer of peizoelectric material on said one of said opposed surfaces and said transducer electrodes being situated between said thin layer and said substrate.

4. A filter assembly as claimed in claim 3, wherein said transducer electrodes are embedded in said thin layer.

5. A filter as claimed in claim 1, wherein said top covering is mounted on said one of said opposed surfaces of said substrate through spacer means, said spacer means being made of rubber material.

6. A filter as claimed in claim 1, further comprising a protective covering enveloping said filter.

7. A filter as claimed in claim 1, wherein said terminal members extend through said substrate and are coupled to respective ones of said comb-type electrode arrays.

8. A filter as claimed in claim 1, wherein said terminal members have a portion adjacent said one end extending from the associated comb-type electrode array along said one of said opposed surfaces of said substrate to a position outside of said substrate.

9. A filter as claimed in claim 3, further comprising damper means applied to said top covering and situated outside said interior chamber.

10. A filter as claimed in claim 3, further comprising a damper plate secured to the other of said opposed surfaces of said substrate.

11. A filter as claimed in claim 10, further comprising a base plate secured to one of the opposed surfaces of said damper plate remote from said substrate.

* * * * *